United States Patent
Kim et al.

(10) Patent No.: US 11,363,712 B2
(45) Date of Patent: Jun. 14, 2022

(54) FLEXIBLE PRINTED CIRCUIT BOARD AND ELECTRONIC DEVICE INCLUDING THE SAME

(71) Applicant: Samsung Electronics Co., Ltd., Suwon-si (KR)

(72) Inventors: Manho Kim, Suwon-si (KR); Keonyoung Seo, Suwon-si (KR); Jongwan Shim, Suwon-si (KR); Kwangsic Choi, Suwon-si (KR); Jaemin Ryoo, Suwon-si (KR); Hwajoong Jung, Suwon-si (KR); Kihuk Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/844,629

(22) Filed: Apr. 9, 2020

(65) Prior Publication Data

US 2020/0329557 A1      Oct. 15, 2020

(30) Foreign Application Priority Data

Apr. 9, 2019    (KR) .................... 10-2019-0041349

(51) Int. Cl.
   *H05K 1/02*      (2006.01)
   *H05K 1/11*      (2006.01)
   *H05K 5/00*      (2006.01)

(52) U.S. Cl.
   CPC ........... *H05K 1/0277* (2013.01); *H05K 1/118* (2013.01); *H05K 5/0017* (2013.01); *H05K 2201/051* (2013.01); *H05K 2201/10151* (2013.01)

(58) Field of Classification Search
   CPC ..... H05K 1/0277; H05K 1/118; H05K 1/0017
   See application file for complete search history.

(56) References Cited

U.S. PATENT DOCUMENTS

| | | |
|---|---|---|
| 7,709,750 B2 | 5/2010 | Hashimoto et al. |
| 8,058,559 B2 | 11/2011 | Muro et al. |
| 9,942,984 B1 | 4/2018 | Su et al. |
| 10,080,277 B1 | 9/2018 | Su et al. |
| 10,159,143 B1 | 12/2018 | Su et al. |
| 2008/0296048 A1 | 12/2008 | Muro et al. |

(Continued)

FOREIGN PATENT DOCUMENTS

| | | |
|---|---|---|
| JP | 2002-223046 A | 8/2002 |
| JP | 2008-300803 A | 12/2008 |

(Continued)

OTHER PUBLICATIONS

International Search Report dated Aug. 12, 2020 in connection with International Patent Application No. PCT/KR2020/004853, 3 pages.

*Primary Examiner* — Hoa C Nguyen
*Assistant Examiner* — Amol H Patel

(57) ABSTRACT

A flexible printed circuit board that includes a signal transmission part that is disposed in a first direction and that includes a signal line that transmits an electrical signal and a ground part disposed in a second direction. The ground part includes a conductive adhesive layer disposed in the first direction and the conductive adhesive layer includes a plurality of conductive balls having electrical conductivity. Various other embodiments are disclosed in the specification.

13 Claims, 14 Drawing Sheets

(56) References Cited

U.S. PATENT DOCUMENTS

| | | | |
|---|---|---|---|
| 2009/0038839 A1* | 2/2009 | Hashimoto | H05K 1/0218 174/350 |
| 2009/0188702 A1* | 7/2009 | Muro | H05K 1/0219 174/254 |
| 2014/0326484 A1* | 11/2014 | Tajima | H05K 1/0216 174/250 |
| 2015/0250080 A1* | 9/2015 | Haruna | H05K 1/0216 174/394 |
| 2016/0134445 A1 | 5/2016 | Kim | |
| 2018/0270947 A1 | 9/2018 | Su et al. | |

FOREIGN PATENT DOCUMENTS

| | | |
|---|---|---|
| JP | 2009-177010 A | 8/2009 |
| KR | 20-0432681 Y1 | 11/2006 |
| KR | 10-0996070 B1 | 11/2010 |
| KR | 10-2016-0055460 A | 5/2016 |

* cited by examiner

FLEXIBLE PRINTED CIRCUIT BOARD AND ELECTRONIC DEVICE INCLUDING THE SAME

CROSS-REFERENCE TO RELATED APPLICATION

This application is based on and claims priority under 35 U.S.C. § 119 to Korean Patent Application No. 10-2019-0041349 filed on Apr. 9, 2019 in the Korean Intellectual Property Office, the disclosure of which is incorporated by reference herein its entirety.

BACKGROUND

1. Field

The disclosure relates to a flexible printed circuit board and an electronic device including the same.

2. Description of Related Art

A flexible printed circuit board may include flexible characteristics in addition to functions of a printed circuit board. Furthermore, the flexible printed circuit board may serve as a medium that transmits a signal depending on a command of an electronic device.

The above information is presented as background information only to assist with an understanding of the disclosure. No determination has been made, and no assertion is made, as to whether any of the above might be applicable as prior art with regard to the disclosure.

SUMMARY

The flexible printed circuit board may include a signal layer and a ground layer. For example, the ground layer may be formed in a mesh form. However, in the flexible printed circuit board, the ground layer in a mesh form that corresponds to a signal line may not be uniformly aligned with the signal line. For example, in the case where the alignment of the signal line and the ground layer is non-uniform in the flexible printed circuit board, an electromagnetic field may vary along the signal line, and therefore impedance unbalance may occur. Furthermore, in the case where the impedance unbalance occurs, the flexible printed circuit board may cause electromagnetic interference.

In addition, the flexibility of the flexible printed circuit board may be deteriorated due to a shielding layer disposed to make up for shortcomings of the ground layer in a mesh form. For example, the shielding layer disposed on one side of the signal layer may thicken the flexible printed circuit board.

Aspects of the disclosure are to address at least the above-mentioned problems and/or disadvantages and to provide at least the advantages described below. Accordingly, an aspect of the disclosure is to provide a flexible printed circuit board and an electronic device including the flexible printed circuit board.

In accordance with an aspect of the disclosure, a flexible printed circuit board includes a signal transmission part that is disposed in a first direction and that includes a signal line that transmits an electrical signal and a ground part disposed in a second direction. The ground part includes a conductive adhesive layer disposed in the first direction, and the conductive adhesive layer includes a plurality of conductive balls having electrical conductivity.

In accordance with another aspect of the disclosure, a flexible printed circuit board includes a first ground part disposed in a first direction, a second ground part disposed in a second direction, and a signal transmission part that is disposed between the first ground part and the second ground part and that includes a signal line that transmits an electrical signal. At least one of the first ground part and the second ground part includes a conductive adhesive layer disposed in a direction toward the signal transmission part, and the conductive adhesive layer includes a plurality of conductive balls having electrical conductivity.

In accordance with another aspect of the disclosure, an electronic device includes a housing, a control part located in the housing, a flexible printed circuit board that transmits an electrical signal depending on a command of the control part, and a module electrically connected with the flexible printed circuit board. The flexible printed circuit board includes a signal transmission part that is disposed in a first direction and that includes a signal line that transmits the electrical signal and a ground part disposed in a second direction. The ground part includes a conductive adhesive layer disposed in a direction toward the signal transmission part, and the conductive adhesive layer includes a plurality of conductive balls having electrical conductivity.

Other aspects, advantages, and salient features of the disclosure will become apparent to those skilled in the art from the following detailed description, which, taken in conjunction with the annexed drawings, discloses various embodiments of the disclosure.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

FIGS. 1 through 12, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Hereinafter, various embodiments of the disclosure will be described with reference to the accompanying drawings. However, those of ordinary skill in the art will recognize that modification, equivalent, and/or alternative on the various embodiments described herein can be variously made without departing from the scope and spirit of the disclosure.

Figure 1:
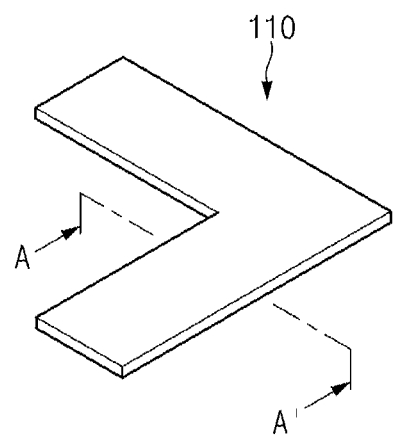
FIG. 1 is a view illustrating a flexible printed circuit board according to an embodiment.

FIG. 1 is a view illustrating a flexible printed circuit board according to an embodiment.

Referring to FIG. 1, the flexible printed circuit board 110 according to an embodiment may transmit a data signal as an electrical signal. According to an embodiment, the flexible printed circuit board 110 may be flexibly bent. For example, the flexible printed circuit board 110 may be bent by being disposed between structures that repeatedly perform sliding motion. In another example, the flexible printed circuit board 110 may be disposed on one side (e.g., a gear) of a structure that repeatedly performs rolling motion and may be bent depending on rotation of the one side (e.g., the gear).

Figure 2:
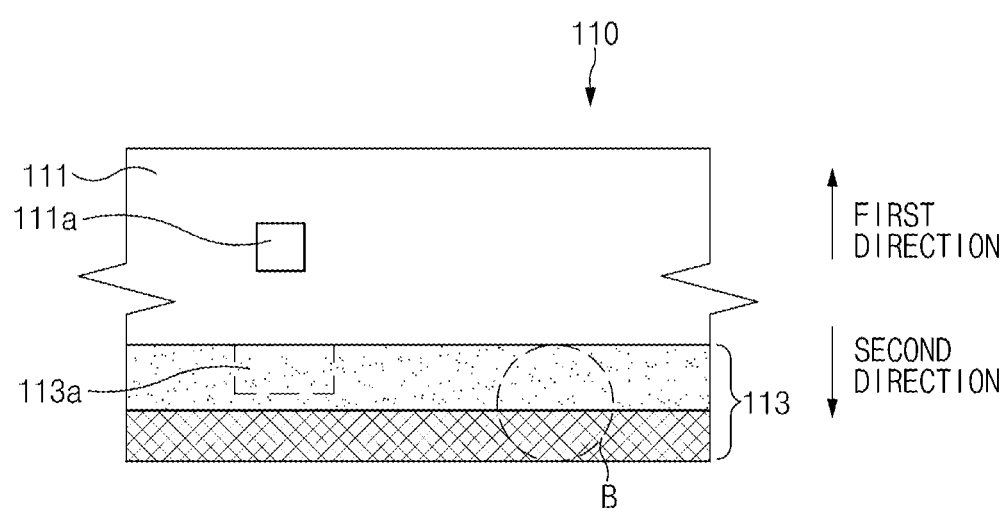
FIG. 2 illustrates a sectional view taken along line A-A' of FIG. 1 according to an embodiment.

FIG. 2 illustrates a sectional view taken along line A-A' of FIG. 1 according to an embodiment.

Referring to FIG. 2, the flexible printed circuit board 110 according to an embodiment may include a signal transmission part 111 and a ground part 113. For example, in the flexible printed circuit board 110, the signal transmission part 111 may be disposed in a first direction, and the ground part 113 may be disposed in a second direction (e.g., the opposite direction to the first direction).

According to an embodiment, the signal transmission part 111 may include at least one signal line 111a. For example, the signal transmission part 111 may be formed of a copper layer.

According to an embodiment, the ground part 113 may serve as a reference point for the voltage of the signal transmission part 111. For example, a current return path 113a corresponding side by side along the electromagnetic field of the signal line 111a may be formed in the ground part 113. The current return path 113a may set characteristic impedance for the signal line 111a.

Figure 3A:
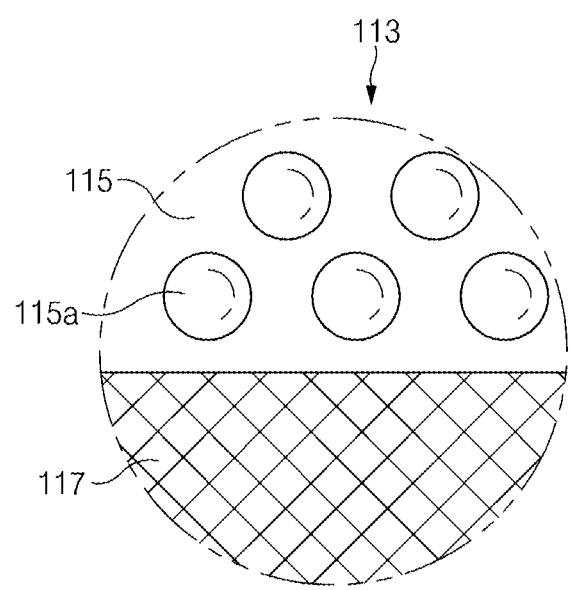
FIG. 3A illustrates a blowup of area "B" of FIG. 2 according to an embodiment.

FIG. 3A illustrates a blowup of area "B" of FIG. 2 according to an embodiment.

Referring to FIG. 3A, the ground part 113 according to an embodiment may include a conductive adhesive layer 115 and a protective layer 117.

According to an embodiment, the conductive adhesive layer 115 may be disposed on one side of the ground part 113 in the first direction. For example, the conductive adhesive layer 115 may include a plurality of conductive balls 115a having electrical conductivity. The conductive balls 115a may exhibit isotropy for an electrical signal of a signal line (e.g., the signal line 111a of FIG. 2). For example, a conductive ball 115a at a position corresponding to the signal line (e.g., the signal line 111a of FIG. 2) may transmit an electrical signal of the signal line depending on the position. According to some embodiments, the conductive balls 115a may be conductive particles and may be formed of a plastic granule of a specified size (e.g., 3 μm to 10 μm). In another example, the conductive balls 115a may be uniformly plated with metal (e.g., nickel or gold) to a specified thickness (e.g., 120 nm).

According to an embodiment, the protective layer 117 may be disposed on an opposite side of the ground part 113 in the second direction (e.g., the opposite direction to the first direction). For example, the protective layer 117 may be formed of an insulation layer. For example, the protective layer 117 may protect the conductive adhesive layer 115 from external impact.

Figure 3B:
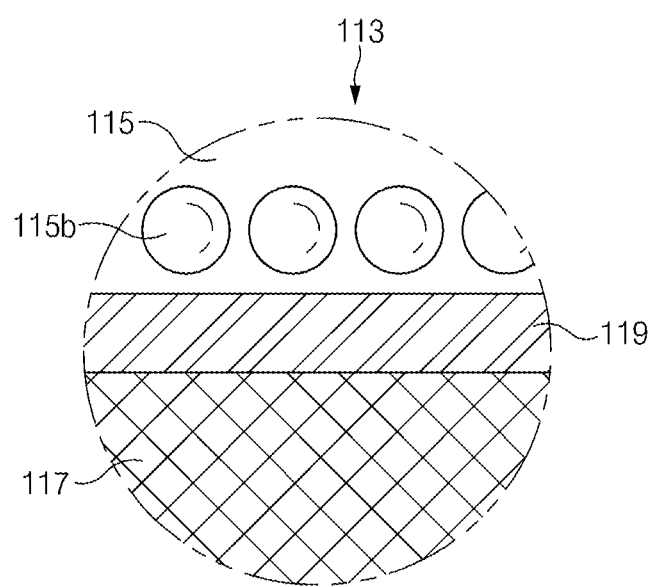
FIG. 3B illustrates a blowup of area "B" of FIG. 2 according to another embodiment.

FIG. 3B illustrates a blowup of area "B" of FIG. 2 according to another embodiment.

Referring to FIG. 3B, the ground part 113 according to an embodiment may include a conductive adhesive layer 115, an electrically-conductive layer 119, and/or a protective layer 117.

According to an embodiment, the conductive adhesive layer 115 may be disposed on one side of the ground part 113 in the first direction. For example, the conductive adhesive layer 115 may include a plurality of conductive balls 115b having electrical conductivity. The conductive balls 115b may exhibit anisotropy for an electrical signal of a signal line (e.g., the signal line 111a of FIG. 2). For example, a conductive ball 115b at a position corresponding to the signal line (e.g., the signal line 111a of FIG. 2) may allow an electrical signal of the signal line to be transmitted depending on the position. According to some embodiments, the conductive balls 115b may have substantially the same structure and characteristic as the conductive balls 115a described above with reference to FIG. 3A.

According to an embodiment, the electrically-conductive layer 119 may be disposed between the conductive adhesive layer 115 and the protective layer 117. For example, the electrically-conductive layer 119 may protect a flexible printed circuit board from signal interference to prevent an external signal from being transmitted to the inside (e.g., the signal transmission part 111 of FIG. 2) of the flexible printed circuit board (e.g., the flexible printed circuit board 110 of FIG. 1).

According to an embodiment, the protective layer 117 may be disposed on an opposite side of the ground part 113 in the second direction (e.g., the opposite direction to the first direction). For example, the protective layer 117 may be formed of an insulation layer. For example, the protective layer 117 may protect the conductive adhesive layer 115 and/or the electrically-conductive layer 119 from external impact.

Figure 4:
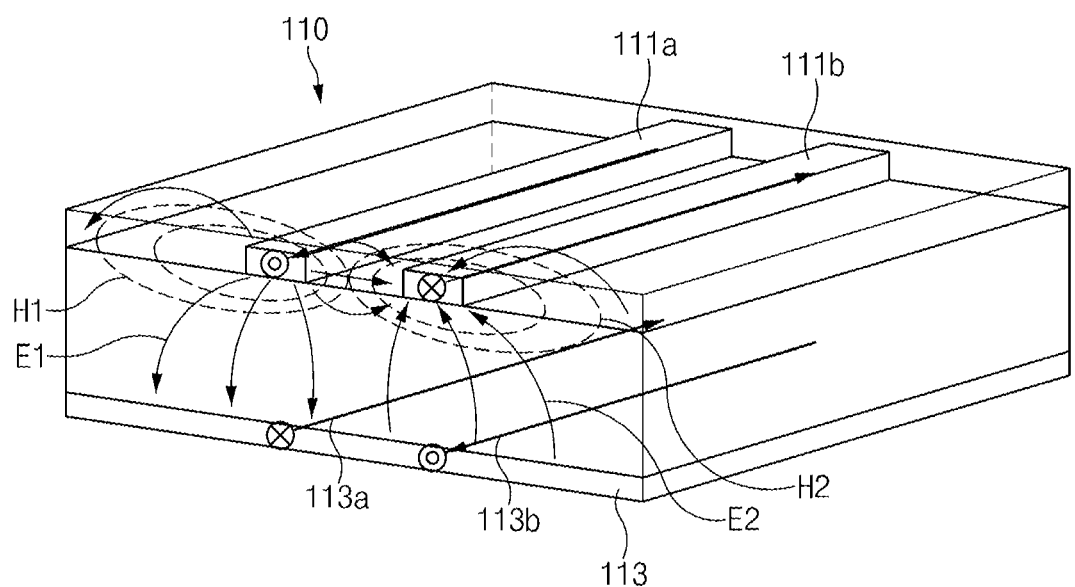
FIG. 4 is a view illustrating a signal flow of the flexible printed circuit board according to an embodiment.
Figure 5:
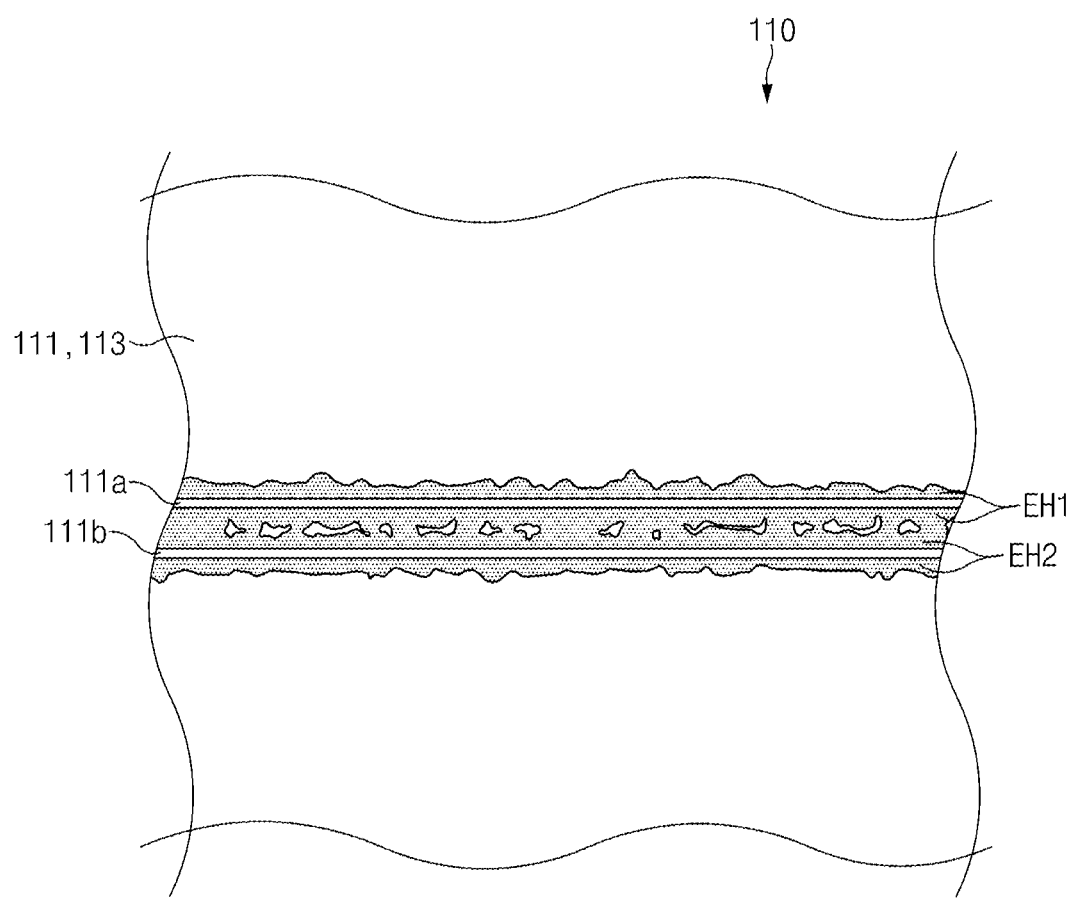
FIG. 5 is a view illustrating magnetic field areas formed around signal lines of FIG. 4 according to an embodiment.

FIG. 4 is a view illustrating a signal flow of the flexible printed circuit board according to an embodiment. FIG. 5 is a view illustrating magnetic field areas formed around signal lines of FIG. 4 according to an embodiment.

Referring to FIGS. 4 and 5, the flexible printed circuit board 110 according to an embodiment may include the signal transmission part 111 and the ground part 113 stacked on each other. For example, the first signal line 111a and a second signal line 111b may be disposed side by side in the signal transmission part 111. For example, the first current return path 113a corresponding to the first signal line 111a and a second current return path 113b corresponding to the second signal line 111b may be formed side by side in the ground part 113.

According to an embodiment, the first signal line 111a and the second signal line 111b may transmit electrical signals in opposite phases. For example, the first signal line 111a may include a return path of current for the second signal line 111b, and the second signal line 111b may include a return path of current for the first signal line 111a. The first signal line 111a may form a first electric field E1 depending on an electrical signal corresponding to a phase with a first period. Furthermore, the first signal line 111a may form a first magnetic field H1 corresponding to the first electric field E1. The second signal line 111b may form a second electric field E2 depending on an electrical signal corresponding to a phase with a second period (e.g., a phase delayed by 180 degrees for the phase with the first period). Furthermore, the second signal line 111b may form a second magnetic field H2 corresponding to the second electric field E2.

According to an embodiment, the first current return path 113a and the second current return path 113b may be formed to correspond to the signal lines 111a and 111b by the first electric field E1, the second electric field E2, the first magnetic field H1, and the second magnetic field H2 that are generated from the signal lines 111a and 111b. For example, when the first electric field E1 and the first magnetic field H1 are generated from the first signal line 111a, the first current return path 113a may form a first electromagnetic field EH1 in a predetermined range between the first signal line 111a and the first current return path 113a, and the form of the first electromagnetic field EH1 may correspond to the first signal line 111a. For example, when the second electric field E2 and the second magnetic field H2 are generated from the second signal line 111b, the second current return path 113b may form a second electromagnetic field EH2 in a predetermined range between the second signal line 111b and the second current return path 113b, and the form of the second electromagnetic field EH2 may correspond to the second signal line 111b. According to some embodiments, the current return paths 113a and 113b that appear by the first electromagnetic field EH1 and the second electromagnetic field EH2 may be formed of a plurality of conductive balls (e.g., anisotropic balls or isotropic balls). According to some embodiments, the current return paths 113a and 113b may set characteristic impedance for the signal lines 111a and 111b.

Figure 6:
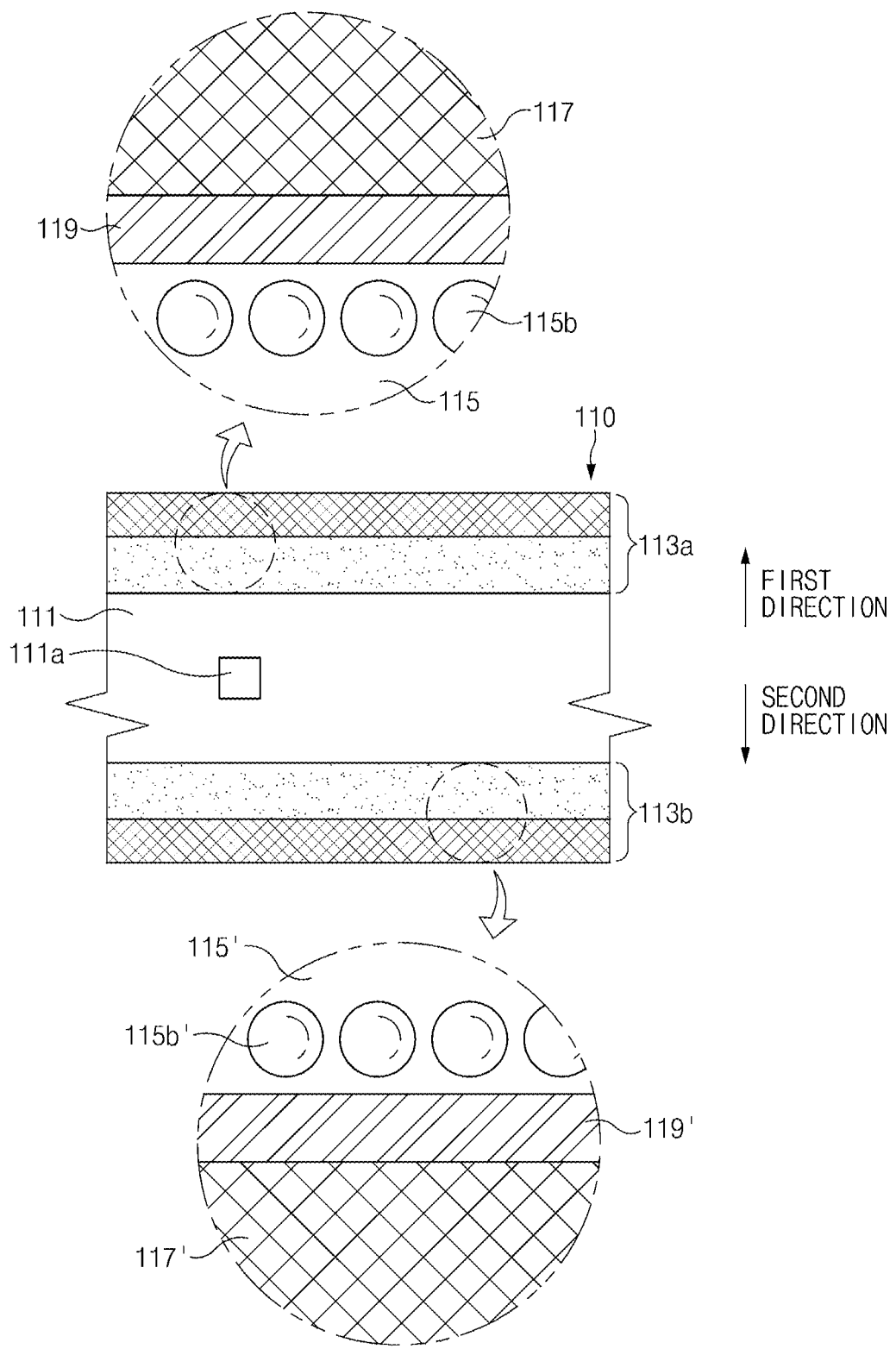
FIG. 6 illustrates a sectional view taken along line A-A' of FIG. 1 according to another embodiment.

FIG. 6 illustrates a sectional view taken along line A-A' of FIG. 1 according to another embodiment.

Referring to FIG. 6, the flexible printed circuit board 110 according to an embodiment may include a signal transmission part 111, a first ground part 113a, and/or a second ground part 113b.

According to an embodiment, the first ground part 113a may be disposed on one side of the flexible printed circuit board 110 in the first direction. For example, the first ground part 113a may include a conductive adhesive layer 115, an electrically-conductive layer 119, and/or a protective layer 117. According to various embodiments, the conductive adhesive layer 115, the electrically-conductive layer 119, and/or the protective layer 117 may be the same as and/or similar to the components of FIG. 3A (or FIG. 3B).

According to an embodiment, the second ground part 113b may be disposed on an opposite side of the flexible printed circuit board 110 in the second direction. The second ground part 113b may be symmetric to the first ground part 113a. For example, the second ground part 113b may include a conductive adhesive layer 115', an electrically-conductive layer 119', and/or a protective layer 117'. According to various embodiments, the conductive adhesive layer 115', the electrically-conductive layer 119', and/or the protective layer 117' may be the same as and/or similar to the components of FIG. 3A (or FIG. 3B).

According to an embodiment, the signal transmission part 111 may include at least one signal line 111a. For example, the signal transmission part 111 may be formed of a copper layer. According to various embodiments, the signal transmission part 111 may be the same as and/or similar to the signal transmission part 111 of FIG. 2.

According to some embodiments, the first ground part 113a and the second ground part 113b may form an electromagnetic field with the signal line 111a. For example, the first ground part 113a and the second ground part 113b may form, on opposite sides of the signal transmission part 111, symmetrical current return paths (e.g., the current return path 113a of FIG. 2) corresponding side by side along the electromagnetic field of the signal line 111a. Because the current return paths are formed on the opposite sides of the signal transmission part 111, the first ground part 113a and the second ground part 113b may more stably transmit high-frequency signals than when the ground part 113 is disposed on one side of the signal transmission part 111.

Figure 7:
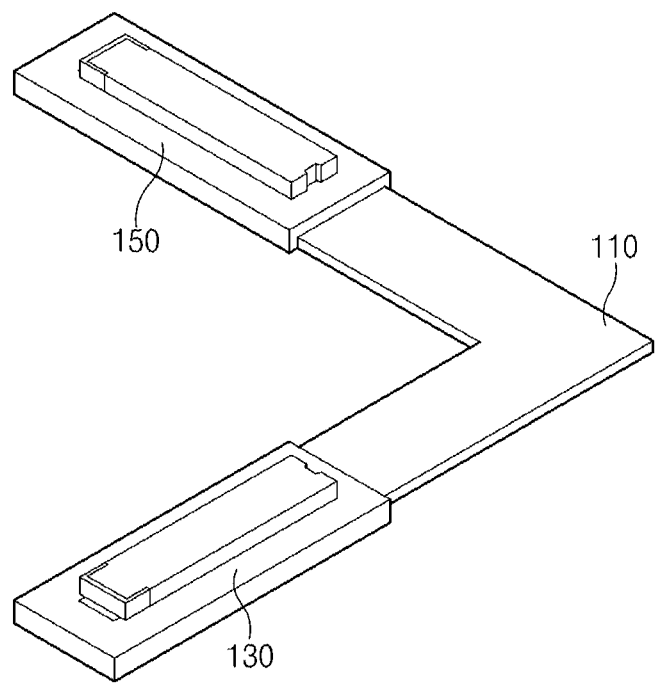
FIG. 7 is a view illustrating the flexible printed circuit board and connecting terminals according to an embodiment.

FIG. 7 is a view illustrating the flexible printed circuit board and connecting terminals according to an embodiment.

Referring to FIG. 7, the flexible printed circuit board 110 according to an embodiment may have a first connecting terminal 130 electrically connected to one side thereof and a second connecting terminal 150 electrically connected to an opposite side thereof. For example, the flexible printed circuit board 110 may transmit a data signal, as an electrical signal, from the first connecting terminal 130 (or the second connecting terminal 150) to the second connecting terminal 150 (or the first connecting terminal 130).

According to an embodiment, the first connecting terminal 130 may be electrically connected to the one side of the flexible printed circuit board 110. For example, the first connecting terminal 130 may transmit a data signal to the second connecting terminal 150 through the flexible printed circuit board 110. Alternatively, the first connecting terminal 130 may receive an electrical signal, as a data signal, from the second connecting terminal 150 through the flexible printed circuit board 110. For example, the first connecting terminal 130 may be connected to correspond to a different connecting terminal.

According to an embodiment, the second connecting terminal 150 may be electrically connected to the opposite side of the flexible printed circuit board 110. For example, the second connecting terminal 150 may transmit data signal to the first connecting terminal 130 through the flexible printed circuit board 110. Alternatively, the second connecting terminal 150 may receive an electrical signal, as a data signal, from the first connecting terminal 130 through the flexible printed circuit board 110. For example, the second connecting terminal 150 may be connected to correspond to a different connecting terminal.

Figure 8A:
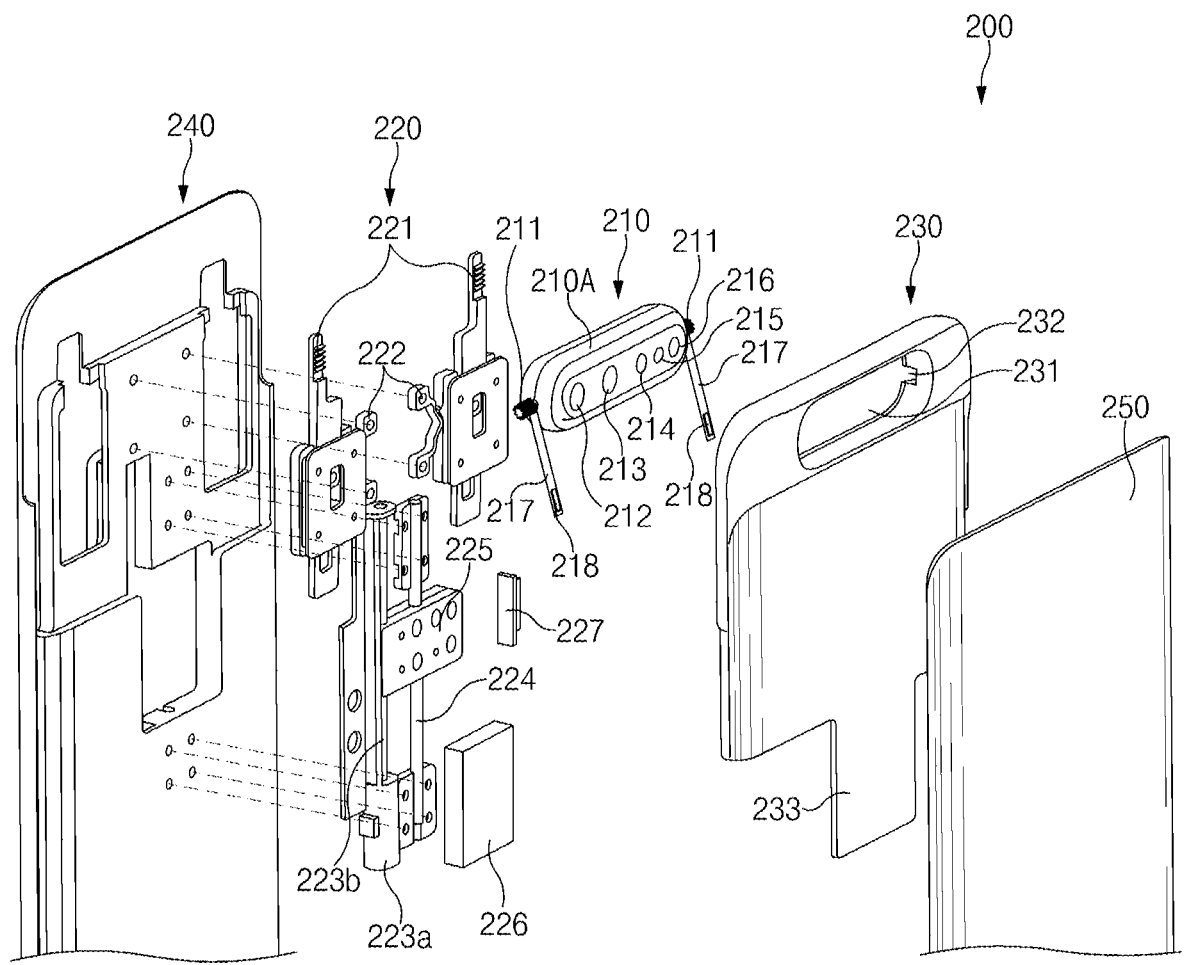
FIG. 8A illustrates an exploded perspective view of an electronic device according to an embodiment as viewed from one side.
Figure 8B:
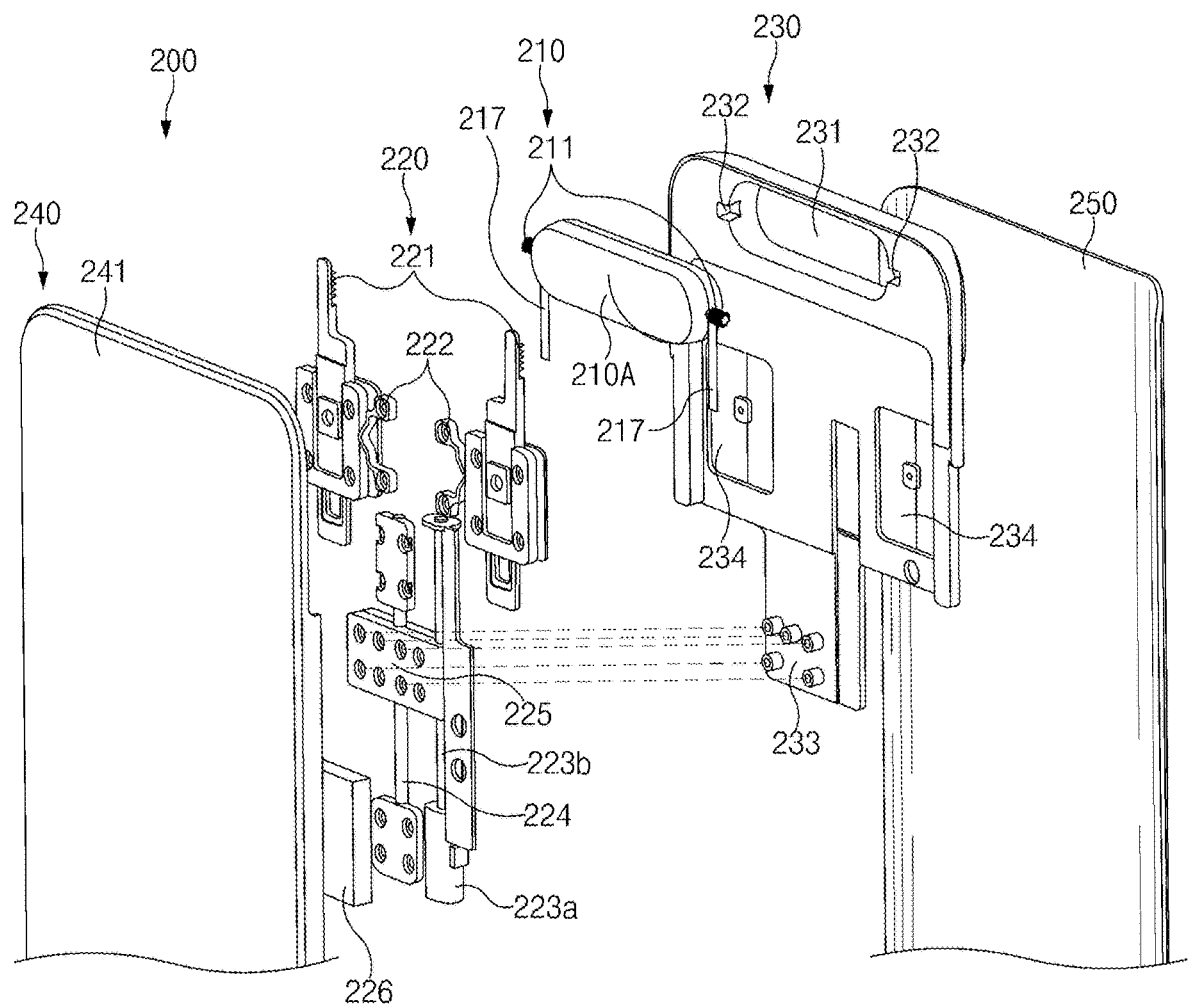
FIG. 8B illustrates an exploded perspective view of the electronic device according to an embodiment as viewed from an opposite side.

FIG. 8A illustrates an exploded perspective view of an electronic device according to an embodiment as viewed from one side (e.g., a rear side). FIG. 8B illustrates an exploded perspective view of the electronic device according to an embodiment as viewed from an opposite side (e.g., a front side).

Referring to FIGS. 8A and 8B, the electronic device 200 may include a camera module 210, a sliding motion control part 220, a sliding part 230, a screen part 240, and/or a back cover 250. In some embodiments, the electronic device 200 may further include one or more other components.

According to an embodiment, the electronic device 200 may include a housing that contains the camera module 210, the sliding motion control part 220, the sliding part 230, the screen part 240, and/or the back cover 250. According to various embodiments, the housing may refer to a structure that forms the exterior of the electronic device 200. Alternatively, the housing may include an internal structure of the electronic device 200.

According to an embodiment, the camera module 210 may include at least one camera device 212, 213, or 216, a flash 214, a sensor module 215, or a flexible printed circuit board 217 (e.g., the flexible printed circuit board 100 of FIG. 1). The at least one camera device 212, 213, or 216 may include one or more lenses, an image sensor, and/or an image signal processor. The flash 214 may include, for example, a light emitting diode or a xenon lamp. The sensor module 215 may generate an electrical signal or a data value that corresponds to an operational state inside the electronic device 200 or an environmental state external to the electronic device 200. The sensor module 215 may include, for example, a proximity sensor, an illuminance sensor, and an HRM sensor. The flexible printed circuit board 217 may include, for example, the flexible printed circuit board 217 (e.g., the flexible printed circuit board 110 of FIG. 1 or 7) and/or a connecting terminal 218 (e.g., the first connecting terminal 130 or the second connecting terminal 150 of FIG. 7). For example, the flexible printed circuit board 217 may be connected with a printed circuit board in the electronic device 200. Furthermore, the connecting terminal 218 may be connected with a corresponding connecting terminal on the printed circuit board in the electronic device 200.

According to various embodiments, the electronic device 200 may further include a non-illustrated sensor module, which may be, for example, at least one of a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or a fingerprint sensor.

According to an embodiment, the camera module 210 may include a camera housing 210A that contains the at least one camera device 212, 213, or 216, the flash 214, or the sensor module 215. The camera housing 210A may include a pinion gear 211 on at least one side surface thereof. For example, the pinion gear 211 may be symmetrically disposed on opposite side surfaces of the camera housing 210A. According to various embodiments, the pinion gear 211 may be integrally formed with the camera housing 210A.

According to an embodiment, the sliding motion control part 220 may include a rack gear 221, a cleek 222, a motor 223a, a rotary part 223b, a guide frame 224, a movable member 225, control circuitry 226, and a control button 227. For example, the control circuitry 226 may control the motor 223a in response to a user input (e.g., an input for switching to front photography, execution of a default APP for front photography, or a click of the control button 227). The rotary part 223b may rotate depending on operation of the motor 223a, and the movable member 225 may be vertically moved depending on the rotation of the rotary part 223b. The movable member 225 may be coupled to a portion (e.g., a movable-member coupling part 233) of the sliding part 230, and the sliding part 230 may be moved depending on the movement of the movable member 225. According to various embodiments, the cleek 222, the motor 223a, and the guide frame 224 may be coupled to a portion of the housing (e.g., a rear surface of the screen part 240 or a rear surface of a display 241).

According to an embodiment, the rack gear 221 may move in response to the movement of the sliding part 230. For example, the rack gear 221 may move a first distance and may thereafter be fixed by the cleek 222. After the rack gear 221 is fixed by the cleek 222, the sliding part 230 may further move a second distance.

According to an embodiment, the pinion gear 211 of the camera module 210 may be engaged with the rack gear 221 of the sliding motion control part 220. For example, the rack gear 221, the camera module 210, and the sliding part 230 may vertically move (e.g., rise or fall) the first distance together. During the movement of the sliding part 230 over the second distance after the rack gear 221 is fixed by the cleek 222, the pinion gear 211 may rotate on the rack gear 221, and the camera module 210 may rotate in an opening 231.

According to various embodiments, the pinion gear 211 may rotate based on the length (or the number of gear teeth) of the rack gear 221. For example, the angle through which the pinion gear 211 rotates may vary depending on the length (or the number of gear teeth) of the rack gear 221. Accordingly, depending on the length (or the number of gear teeth) of the rack gear 221, the camera module 210 coupled with the pinion gear 211 may rotate through a predetermined angle (e.g., 10 degree to 270 degrees with respect to the rear surface of the electronic device 200). For example, the length (or the number of gear teeth) of the rack gear 221 may be set such that the pinion gear 211 rotates through 180 degrees. In various embodiments, the length (or the number of gear teeth) of the rack gear 221 may be set such that the pinion gear 211 rotates through 180 degrees or less (an angle of 0 degrees to 180 degrees). In another example, the length (or the number of gear teeth) of the rack gear 221 may be set such that the pinion gear 211 rotates through 180 degrees or more (an angle of 180 degrees to 300 degrees). When the pinion gear 211 rotates through 180 degrees or more, the camera module 210 may rotate through an angle more appropriate for taking a selfie.

According to an embodiment, the sliding part 230 may include the opening 231, a gear recess 232, and the movable-member coupling part 233. For example, the opening 231 may be formed in a portion of the sliding part 230 (e.g., on an upper side of the sliding part 230). The opening 231 may be formed to correspond to the size of the camera module 210. The camera module 210 may be disposed in the opening 231. The camera module 210 may rotate in the opening 231 about the pinion gear 211. The pinion gear 211 may be disposed in the gear recess 232. The pinion gear 211 may rotate in the gear recess 232. The movable-member coupling part 233 may be coupled to the movable member 225. Accordingly, the sliding part 230 may move depending on a movement (e.g., a vertical movement) of the movable member 225.

According to various embodiments, the sliding part 230 may include a gear guide recess 234. For example, the rack gear 221 may be disposed to correspond to the gear guide recess 234. The radius by which the rack gear 221 moves may be determined by the gear guide recess 234.

According to an embodiment, the screen part 240 may include the display 241. For example, the display 241 may be coupled with, or disposed adjacent to, touch detection circuitry, a pressure sensor capable of measuring the intensity (pressure) of a touch, and/or a digitizer for detecting a stylus pen of a magnetic type. In some embodiments, at least a part of a sensor module and/or at least a part of key input devices may be disposed on a portion of the display 241. According to various embodiments, the display 241 may be implemented to be a maximum area on the front surface of the electronic device 200 because there is no camera disposed on the front surface of the electronic device 200.

According to an embodiment, the back cover 250 may cover a portion of the sliding part 230. For example, the opening 231 may be formed in a portion of the sliding part 230 (e.g., on an upper side of the sliding part 230) that is not hidden by the back cover 250. The sliding part 230 may vertically move between the screen part 240 and the back cover 250. The back cover 250 may be formed of, for example, coated or colored glass, ceramic, polymer, metal (e.g., aluminum, stainless steel (STS), or magnesium), or a combination of at least two thereof.

According to an embodiment, the electronic device 200 may include an audio module. For example, the audio module may include a microphone hole and a speaker hole. A microphone for obtaining an external sound may be disposed in the microphone hole, and in some embodiments, a plurality of microphones may be disposed in the microphone hole to detect the direction of a sound. The speaker hole may include an external speaker hole and a receiver hole for a telephone call. In some embodiments, the speaker hole and the microphone hole may be implemented to be a single hole, or a speaker (e.g., a piezoelectric speaker) may be included without the speaker hole.

According to an embodiment, the electronic device 200 may include a key input device. For example, the key input device may include a home key button disposed on the front surface of the electronic device 200, a touch pad disposed around the home key button, and/or a side key button 227 disposed on a side surface of the electronic device 200. According to another embodiment, the electronic device 200 may not include all or some of the aforementioned key input devices, and the key input devices not included may be implemented in different forms such as soft keys on the display 241.

According to an embodiment, the electronic device 200 may include a connector hole. For example, the connector hole may include a first connector hole in which to receive a connector (e.g., a USB connector) for transmitting and receiving power and/or data with an external electronic device and/or a second connector hole (e.g., an earphone jack) in which to receive a connector for transmitting and receiving audio signals with an external electronic device.

According to an embodiment, the electronic device 200 may include a printed circuit board between the screen part 240 and the back cover 250. For example, a processor (e.g., the control circuitry 126), a memory, and/or an interface may be mounted on the printed circuit board. The processor may include, for example, one or more of a central processing unit, an application processor, a graphic processing unit, an image signal processor, a sensor hub processor, or a communication processor.

Figure 9:
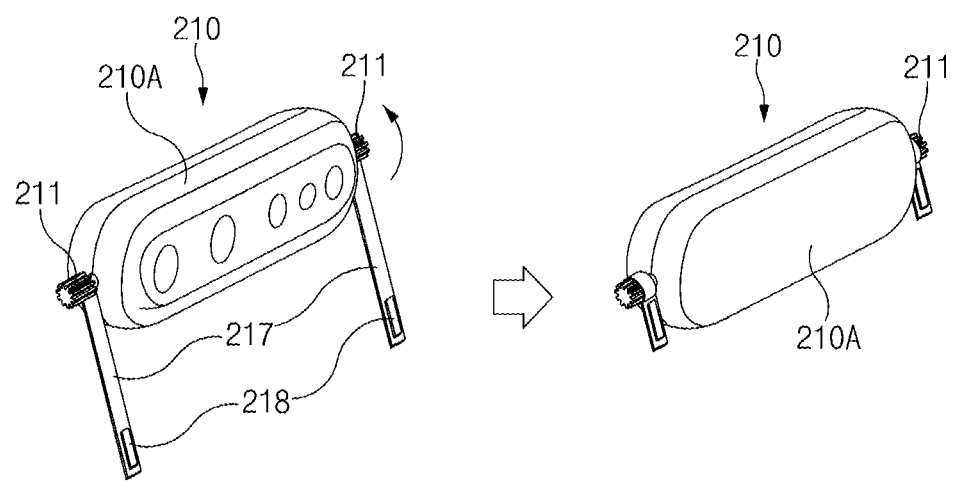
FIG. 9 is a view illustrating operations before and after a flexible printed circuit board is bent according to an embodiment.

FIG. 9 is a view illustrating operations before and after the flexible printed circuit board is bent according to an embodiment.

Referring to FIG. 9, the flexible printed circuit board 217 according to an embodiment may have at least one bending portion. For example, the flexible printed circuit board 217 may include a first portion extending from the camera module 210 in a first direction (e.g., the axial direction of the pinion gear 211) and a second portion extending in a second direction perpendicular to the first direction. For example, the connecting terminal 218 (e.g., the first connecting terminal 130 or the second connecting terminal 150 of FIG. 1) may be disposed on the first portion and/or the second portion.

According to an embodiment, the flexible printed circuit board 217 may be disposed between the camera housing 210A and the pinion gear 211. For example, part of the first portion may be disposed to pass through a portion extending from a rotary shaft of the pinion gear 211. For example, the remaining part of the first portion may be disposed parallel with the portion extending from the rotary shaft of the pinion gear 211.

According to various embodiments, the flexible printed circuit board 217 may be configured to be wound around the rotary shaft of the pinion gear 211 as the camera module 210 rotates. For example, when the camera module 210 rotates in any one direction, the flexible printed circuit board 217 may be bent such that one surface (or an opposite surface) of the second portion faces the rotary shaft of the pinion gear 211.

Figure 10:
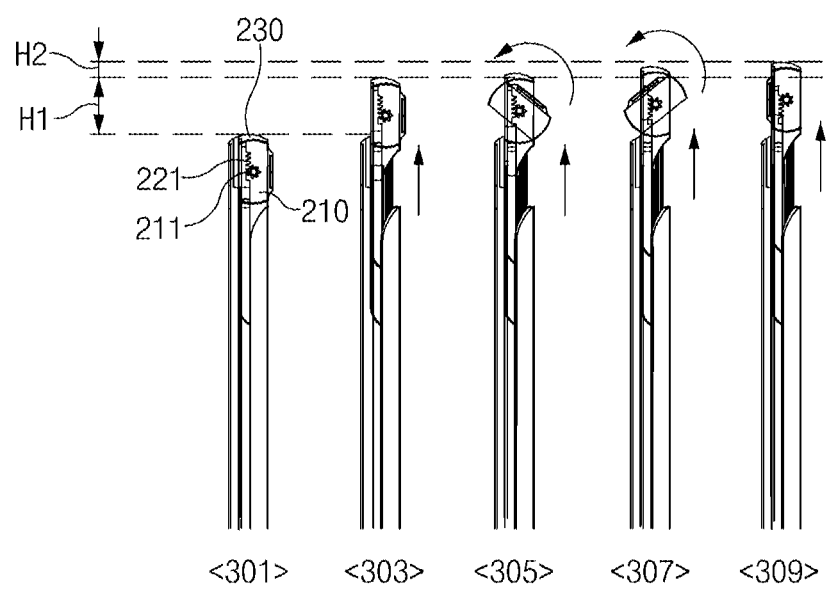
FIG. 10 is a side view sequentially illustrating rising motion of a camera module according to various embodiments.

FIG. 10 is a side view sequentially illustrating rising motion of the camera module according to various embodiments.

Referring to FIG. 10, the camera module 210 may perform rising motion or rotational motion based on a user input (e.g., an input for switching to front photography or execution of a default APP for front photography). At least one camera included in the camera module 210 may be used as a front camera (e.g., a selfie camera) according to rotation of the camera module 210.

According to an embodiment, in state 301, the camera included in the camera module 210 may face toward the rear of the electronic device 200. At this time, the camera included in the camera module 210 may be used as a rear camera.

According to an embodiment, in state 303, the camera module 210, the rack gear 221, and the sliding part 230 may move upward based on the user input. For example, the camera module 210, the rack gear 221, and the sliding part 230 may move a first movement distance H1. In state 303, the rack gear 221 may be fixed by a cleek (e.g., the cleek 222).

According to an embodiment, in states 305, 307, and 309, the camera module 210 may move upward and rotate. For example, in states 305, 307, and 309, the rack gear 221 may be fixed by the cleek, and the camera module 210 and the sliding part 230 may move upward. The camera module 210 and the sliding part 230 may move upward by a second movement distance H2. The pinion gear 211 engaged with the rack gear 221 may rotate. Accordingly, the camera module 210 may rotate. In state 309, the camera included in the camera module 210 may face toward the front of the electronic device 200. At this time, the camera included in the camera module 210 may be used as a front camera.

According to various embodiments, the pinion gear 211 may rotate based on the length (or the number of gear teeth) of the rack gear 221. For example, the angle through which the pinion gear 211 rotates may vary depending on the length (or the number of gear teeth) of the rack gear 221. Accordingly, depending on the length (or the number of gear teeth) of the rack gear 221, the camera module 210 coupled with the pinion gear 211 may rotate by a predetermined angle (e.g., 10 degree to 270 degrees with respect to the rear surface of the electronic device 200). For example, the length (or the number of gear teeth) of the rack gear 221 may be set such that the pinion gear 211 rotates through 180 degrees. In various embodiments, the length (or the number of gear teeth) of the rack gear 221 may be set such that the pinion gear 211 rotates through 180 degrees or less (an angle of 0 degrees to 180 degrees). Alternatively, the length (or the number of gear teeth) of the rack gear 221 may be set such that the pinion gear 211 rotates through 180 degrees or more (an angle of 180 degrees to 300 degrees). When the pinion gear 211 rotates through 180 degrees or more, the camera module 210 may rotate through an angle more appropriate for taking a selfie.

Figure 11:
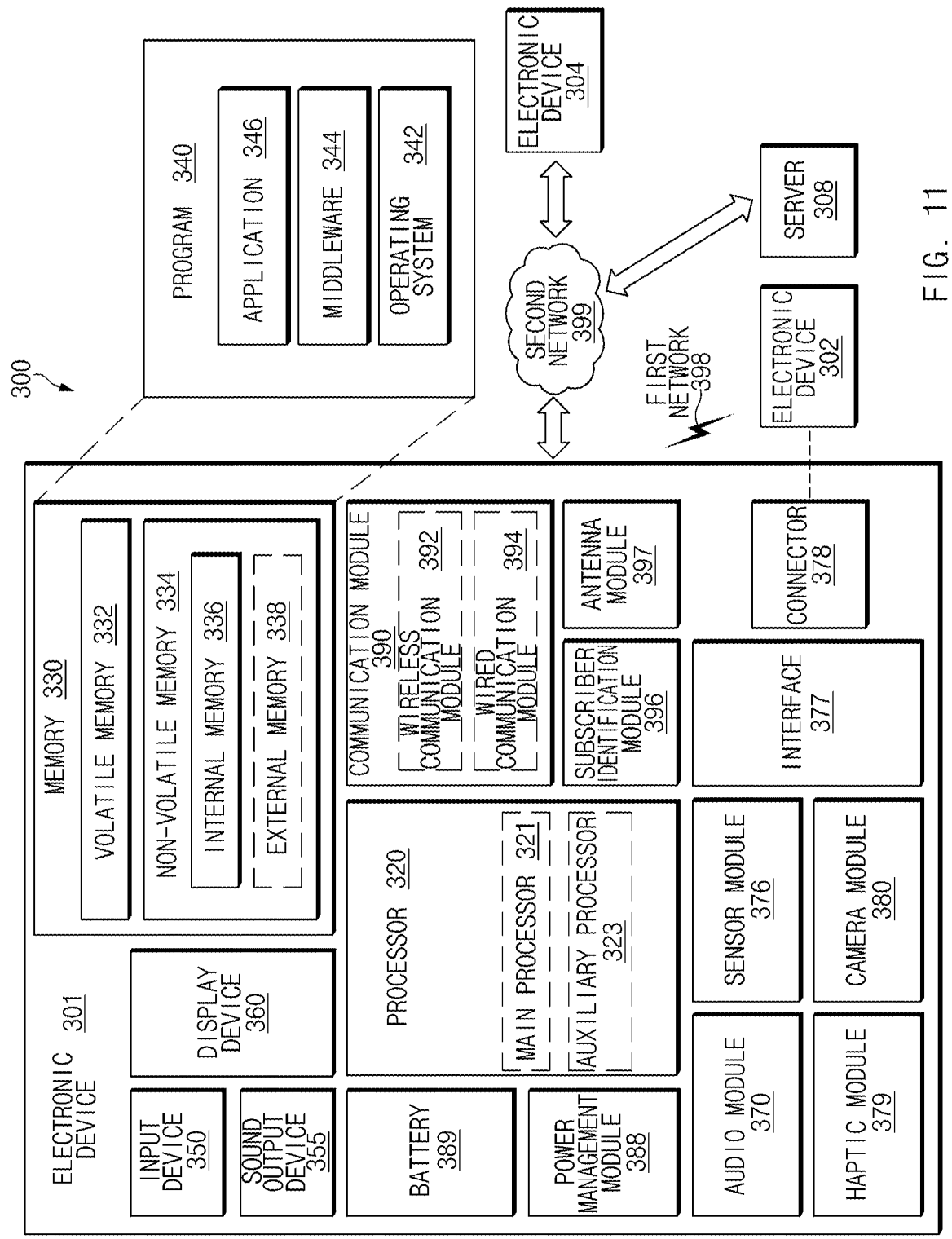
FIG. 11 is a block diagram of an electronic device in a network environment according to various embodiments.

FIG. 11 is a block diagram illustrating an electronic device 1101 in a network environment 1100 according to various embodiments. Referring to FIG. 11, the electronic device 1101 in the network environment 1100 may communicate with an electronic device 1102 via a first network 1198 (e.g., a short-range wireless communication network), or an electronic device 1104 or a server 1108 via a second network 1199 (e.g., a long-range wireless communication network). According to an embodiment, the electronic device 1101 may communicate with the electronic device 1104 via the server 1108. According to an embodiment, the electronic device 1101 may include a processor 1120, memory 1130, an input device 1150, a sound output device 1155, a display device 1160, an audio module 1170, a sensor module 1176, an interface 1177, a haptic module 1179, a camera module 1180, a power management module 1188, a battery 1189, a communication module 1190, a subscriber identification module (SIM) 1196, or an antenna module 1197. In some embodiments, at least one (e.g., the display device 1160 or the camera module 1180) of the components may be omitted from the electronic device 1101, or one or more other components may be added in the electronic device 1101. In some embodiments, some of the components may be implemented as single integrated circuitry. For example, the sensor module 1176 (e.g., a fingerprint sensor, an iris sensor, or an illuminance sensor) may be implemented as embedded in the display device 1160 (e.g., a display).

The processor 1120 may execute, for example, software (e.g., a program 1140) to control at least one other component (e.g., a hardware or software component) of the electronic device 1101 coupled with the processor 1120, and may perform various data processing or computation. According to one embodiment, as at least part of the data processing or computation, the processor 1120 may load a command or data received from another component (e.g., the sensor module 1176 or the communication module 1190) in volatile memory 1132, process the command or the data stored in the volatile memory 1132, and store resulting data in non-volatile memory 1134. According to an embodiment, the processor 1120 may include a main processor 1121 (e.g., a central processing unit (CPU) or an application processor (AP)), and an auxiliary processor 1123 (e.g., a graphics processing unit (GPU), an image signal processor (ISP), a sensor hub processor, or a communication processor (CP)) that is operable independently from, or in conjunction with, the main processor 1121. Additionally or alternatively, the auxiliary processor 1123 may be adapted to consume less power than the main processor 1121, or to be specific to a specified function. The auxiliary processor 1123 may be implemented as separate from, or as part of the main processor 1121.

The auxiliary processor 1123 may control at least some of functions or states related to at least one component (e.g., the display device 1160, the sensor module 1176, or the communication module 1190) among the components of the electronic device 1101, instead of the main processor 1121 while the main processor 1121 is in an inactive (e.g., sleep) state, or together with the main processor 1121 while the main processor 1121 is in an active state (e.g., executing an application). According to an embodiment, the auxiliary processor 1123 (e.g., an image signal processor or a communication processor) may be implemented as part of another component (e.g., the camera module 1180 or the communication module 1190) functionally related to the auxiliary processor 1123.

The memory 1130 may store various data used by at least one component (e.g., the processor 1120 or the sensor module 1176) of the electronic device 1101. The various data may include, for example, software (e.g., the program 1140) and input data or output data for a command related thereto. The memory 1130 may include the volatile memory 1132 or the non-volatile memory 1134.

The program 1140 may be stored in the memory 1130 as software, and may include, for example, an operating system (OS) 1142, middleware 1144, or an application 1146.

The input device 1150 may receive a command or data to be used by other component (e.g., the processor 1120) of the electronic device 1101, from the outside (e.g., a user) of the electronic device 1101. The input device 1150 may include, for example, a microphone, a mouse, a keyboard, or a digital pen (e.g., a stylus pen).

The sound output device 1155 may output sound signals to the outside of the electronic device 1101. The sound output device 1155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 1160 may visually provide information to the outside (e.g., a user) of the electronic device 1101. The display device 1160 may include, for example, a display, a hologram device, or a projector and control circuitry to control a corresponding one of the display, hologram device, and projector. According to an embodiment, the display device 1160 may include touch circuitry adapted to detect a touch, or sensor circuitry (e.g., a pressure sensor) adapted to measure the intensity of force incurred by the touch.

The audio module 1170 may convert a sound into an electrical signal and vice versa. According to an embodiment, the audio module 1170 may obtain the sound via the input device 1150, or output the sound via the sound output device 1155 or a headphone of an external electronic device (e.g., an electronic device 1102) directly (e.g., wiredly) or wirelessly coupled with the electronic device 1101.

The sensor module 1176 may detect an operational state (e.g., power or temperature) of the electronic device 1101 or an environmental state (e.g., a state of a user) external to the electronic device 1101, and then generate an electrical signal or data value corresponding to the detected state. According to an embodiment, the sensor module 1176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 1177 may support one or more specified protocols to be used for the electronic device 1101 to be coupled with the external electronic device (e.g., the electronic device 1102) directly (e.g., wiredly) or wirelessly. According to an embodiment, the interface 1177 may include, for example, a high definition multimedia interface (HDMI), a universal serial bus (USB) interface, a secure digital (SD) card interface, or an audio interface.

A connecting terminal 1178 may include a connector via which the electronic device 1101 may be physically connected with the external electronic device (e.g., the electronic device 1102). According to an embodiment, the connecting terminal 1178 may include, for example, a HDMI connector, a USB connector, a SD card connector, or an audio connector (e.g., a headphone connector).

The haptic module 1179 may convert an electrical signal into a mechanical stimulus (e.g., a vibration or a movement) or electrical stimulus which may be recognized by a user via his tactile sensation or kinesthetic sensation. According to an embodiment, the haptic module 1179 may include, for example, a motor, a piezoelectric element, or an electric stimulator.

The camera module 1180 may capture a still image or moving images. According to an embodiment, the camera module 1180 may include one or more lenses, image sensors, image signal processors, or flashes.

The power management module 1188 may manage power supplied to the electronic device 1101. According to one embodiment, the power management module 1188 may be implemented as at least part of, for example, a power management integrated circuit (PMIC).

The battery 1189 may supply power to at least one component of the electronic device 1101. According to an embodiment, the battery 1189 may include, for example, a primary cell which is not rechargeable, a secondary cell which is rechargeable, or a fuel cell.

The communication module 1190 may support establishing a direct (e.g., wired) communication channel or a wireless communication channel between the electronic device 1101 and the external electronic device (e.g., the electronic device 1102, the electronic device 1104, or the server 1108) and performing communication via the established communication channel. The communication module 1190 may include one or more communication processors that are operable independently from the processor 1120 (e.g., the application processor (AP)) and supports a direct (e.g., wired) communication or a wireless communication. According to an embodiment, the communication module 1190 may include a wireless communication module 1192 (e.g., a cellular communication module, a short-range wireless communication module, or a global navigation satellite system (GNSS) communication module) or a wired communication module 1194 (e.g., a local area network (LAN) communication module or a power line communication (PLC) module). A corresponding one of these communication modules may communicate with the external electronic device via the first network 1198 (e.g., a short-range communication network, such as Bluetooth™, wireless-fidelity (Wi-Fi) direct, or infrared data association (IrDA)) or the second network 1199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 1192 may identify and authenticate the electronic device 1101 in a communication network, such as the first network 1198 or the second network 1199, using subscriber information (e.g., international mobile subscriber identity (IMSI)) stored in the subscriber identification module 1196.

The antenna module 1197 may transmit or receive a signal or power to or from the outside (e.g., the external electronic device) of the electronic device 1101. According to an embodiment, the antenna module 1197 may include an antenna including a radiating element composed of a conductive material or a conductive pattern formed in or on a substrate (e.g., PCB). According to an embodiment, the antenna module 1197 may include a plurality of antennas. In such a case, at least one antenna appropriate for a communication scheme used in the communication network, such as the first network 1198 or the second network 1199, may be selected, for example, by the communication module 1190 (e.g., the wireless communication module 1192) from the plurality of antennas. The signal or the power may then be transmitted or received between the communication module 1190 and the external electronic device via the selected at least one antenna. According to an embodiment, another component (e.g., a radio frequency integrated circuit (RFIC)) other than the radiating element may be additionally formed as part of the antenna module 1197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 1101 and the external electronic device 1104 via the server 1108 coupled with the second network 1199. Each of the electronic devices 1102 and 1104 may be a device of a same type as, or a different type, from the electronic device 1101. According to an embodiment, all or some of operations to be executed at the electronic device 1101 may be executed at one or more of the external electronic devices 1102, 1104, or 1108. For example, if the electronic device 1101 should perform a function or a service automatically, or in response to a request from a user or another device, the electronic device 1101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1101. The electronic device 1101 may provide the outcome, with or without further processing of the outcome, as at least part of a reply to the request. To that end, a cloud computing, distributed computing, or client-server computing technology may be used, for example.

Figure 12:
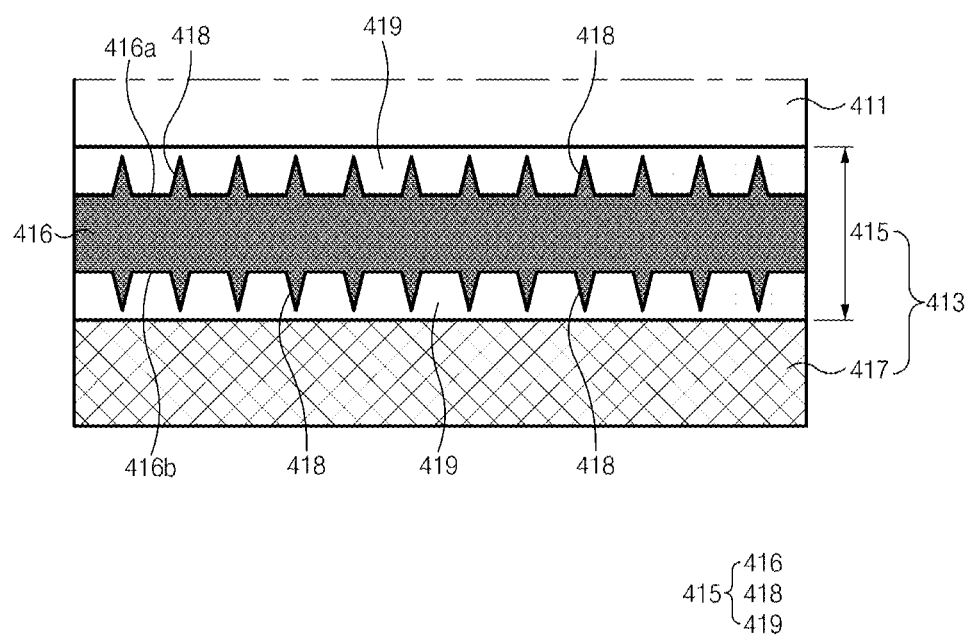
FIG. 12 is a view illustrating the flexible printed circuit board according to another embodiment.

FIG. 12 is a view illustrating the flexible printed circuit board according to another embodiment.

Referring to FIG. 12, the flexible printed circuit board 410 may include a signal transmission part 411 and a ground part 413. The signal transmission part 411 and the ground part 413 may be referred to as the signal transmission part 111 and ground part 113 illustrated in FIGS. 2, 4, and 6.

In one embodiment, the conductive adhesive layer 415 may include a conductive material and an adhesive material surrounding at least a portion of the conductive material. In various embodiments, an adhesive material may be an insulating material.

In one embodiment, the conductive adhesive layer 415 may be electrically connected to the ground area of the substrate included in the electronic device (e.g., the electronic device 200 of FIGS. 8A, 8B). Thereby, the conductive adhesive layer 415 may function as the ground part 413 of the flexible printed circuit board 410.

In various embodiments, the conductive adhesive layer 415 may include conductive particles (e.g. the conductive ball 115a, 115b of FIGS. 3A, 3B) and/or conductive structures (e.g. the metal layer 416, the metal needle 418). In one embodiment, the conductive particles and/or the conductive structure may be completely surrounded by the adhesive material. In one embodiment, the conductive particles (e.g. the conductive ball 115a, 115b of FIGS. 3A, 3B) and/or the conductive structure (e.g. the metal needle 418) may be projected or exposed to the surface of the conductive adhesive layer 415.

Referring to FIG. 12, the conductive adhesive layer 415 may include an adhesive material 419, a metal layer 416, and a metal needle 418. In one embodiment, the metal layer 416 may include a first surface 416a facing the signal transmission part 411 and a second surface 416b facing the protective layer 417. The metal layer 416 and the metal needle 418 may be surrounded by the adhesive material 419. The metal needle 418 may be formed on the first surface 416a and/or the second surface 416b of the metal layer 416. The metal needle 418 may be sharply formed in the direction toward the signal transmission part 411 and/or the protective layer 417. The metal needle 418 may be formed in plural. The plurality of metal needles 418 may be arranged on the surface 416a, 416b of the metal layer. In various embodiments, the metal layer 416 may be formed thinner than the signal line (e.g. the signal line 113a of FIG. 2) included in the signal transmission part 411.

In various embodiments, the conductive particles may include a spherical conductive ball illustrated in FIGS. 3A, 3B, and 6. In various embodiments, the conductive particles may have various shapes. For example, the conductive particles may be formed in an elliptical spherical shape. For example, the conductive particles may be partially formed in a sharped shape.

A flexible printed circuit board (e.g., the flexible printed circuit board 110 of FIG. 2) according to various embodiments may include a signal transmission part (e.g., the signal transmission part 111 of FIG. 2) that is disposed in a first direction and that includes a signal line (e.g., the signal line 111a of FIG. 2) that transmits an electrical signal and a ground part (e.g., the ground part 113 of FIG. 2) that is disposed in a second direction. The ground part may include a conductive adhesive layer (e.g., the conductive adhesive layer 115 of FIG. 3A and/or FIG. 3B) that is disposed in the first direction, and the conductive adhesive layer may include a plurality of conductive balls (e.g., the conductive balls 115a of FIG. 3A and/or the conductive balls 115b of FIG. 3B) that have electrical conductivity.

According to various embodiments, the conductive balls (e.g., the conductive balls 115a of FIG. 3A and/or the conductive balls 115b of FIG. 3B) may transmit the electrical signal of the signal line (e.g., the signal line 111a of FIG. 2).

According to various embodiments, the conductive balls (e.g., the conductive balls 115a of FIG. 3A and/or the conductive balls 115b of FIG. 3B) may exhibit isotropy.

According to various embodiments, the conductive balls (e.g., the conductive balls 115a of FIG. 3A and/or the conductive balls 115b of FIG. 3B) may exhibit anisotropy in a vertical direction for the electrical signal of the signal line (e.g., the signal line 111a of FIG. 2).

According to various embodiments, the ground part (e.g., the ground part 113 of FIG. 2) may include an insulating protective layer (e.g., the protective layer 117 of FIG. 3A and/or FIG. 3B) that is disposed in the second direction.

According to various embodiments, the ground part (e.g., the ground part 113 of FIG. 2) may include an electrically-conductive layer (e.g., the electrically-conductive layer 119 of FIG. 3B) that is disposed between the conductive adhesive layer (e.g., the conductive adhesive layer 115 of FIG. 3A and/or FIG. 3B) and the protective layer (e.g., the protective layer 117 of FIG. 3A and/or FIG. 3B).

According to various embodiments, a connecting terminal (e.g., the first connecting terminal 130 and/or the second connecting terminal 150 of FIG. 7) that is electrically connected with the flexible printed circuit board (e.g., the flexible printed circuit board of FIG. 2) may be disposed on at least one side of the flexible printed circuit board, and a contact point of a ground electrically connected with the connecting terminal may be formed on the ground part (e.g., the ground part 113 of FIG. 2).

A flexible printed circuit board (e.g., the flexible printed circuit board 110 of FIG. 6) according to various embodiments may include a first ground part (e.g., the first ground part 113a of FIG. 6) that is disposed in a first direction, a second ground part (e.g., the second ground part 113b of FIG. 6) that is disposed in a second direction, and a signal transmission part (e.g., the signal transmission part 111 of FIG. 6) that is disposed between the first ground part and the second ground part and that includes a signal line (e.g., the signal line 111a of FIG. 6) that transmits an electrical signal. At least one of the first ground part and the second ground part may include a conductive adhesive layer (e.g., the conductive adhesive layer 115 and/or 115' of FIG. 6) that is disposed in a direction toward the signal transmission part, and the conductive adhesive layer may include a plurality of conductive balls (e.g., the conductive balls 115b and/or 115b' of FIG. 6) that have electrical conductivity.

According to various embodiments, the conductive balls (e.g., the conductive balls 115b and/or 115b' of FIG. 6) may transmit the electrical signal of the signal line (e.g., the signal line 111a of FIG. 6).

According to various embodiments, the conductive balls (e.g., the conductive balls 115b and/or 115b' of FIG. 6) may exhibit isotropy.

According to various embodiments, the conductive balls (e.g., the conductive balls 115b and/or 115b' of FIG. 6) may exhibit anisotropy in a vertical direction for the electrical signal of the signal line (e.g., the signal line 111a of FIG. 6).

According to various embodiments, at least one of the first ground part (e.g., the first ground part 113a of FIG. 6) and the second ground part (e.g., the second ground part 113b of FIG. 6) may include an insulating protective layer (e.g., the protective layer 117 and/or 117' of FIG. 6) that is disposed on an opposite side to the conductive adhesive layer (e.g., the conductive adhesive layer 115 and/or 115' of FIG. 6).

According to various embodiments, at least one of the first ground part (e.g., the first ground part 113a of FIG. 6) and the second ground part (e.g., the second ground part 113b of FIG. 6) may include an electrically-conductive layer (e.g., the electrically-conductive layer 119 and/or 119' of FIG. 6) that is disposed between the conductive adhesive layer (e.g., the conductive adhesive layer 115 and/or 115' of FIG. 6) and the protective layer (e.g., the protective layer 117 and/or 117' of FIG. 6).

According to various embodiments, a connecting terminal (e.g., the first connecting terminal 130 and/or the second connecting terminal 150 of FIG. 7) that is electrically connected with the flexible printed circuit board (e.g., the flexible printed circuit board of FIG. 6) may be disposed on at least one side of the flexible printed circuit board, and a contact point of a ground electrically connected with the connecting terminal may be formed on at least one of the first ground part (e.g., the first ground part 113a of FIG. 6) and the second ground part (e.g., the second ground part 113b of FIG. 6).

According to various embodiments, the signal transmission part (e.g., the signal transmission part 111 of FIG. 6) may transmit the electrical signal such that a control part (e.g., the sliding motion control part 220 of FIG. 8A and/or FIG. 8B) and a sensor module (e.g., the sensor module 215 of FIG. 8A) of an electronic device (e.g., the electronic device 200 of FIG. 8A and/or FIG. 8B) are operatively connected.

An electronic device (e.g., the electronic device 200 of FIG. 8A and/or FIG. 8B) according to various embodiments may include a housing, a control part (e.g., the sliding motion control part 220 of FIG. 8A and/or FIG. 8B) that is located in the housing, a flexible printed circuit board (e.g., the flexible printed circuit board 217 of FIG. 8A and/or FIG. 8B) that transmits an electrical signal depending on a command of the control part, and a module (e.g., the camera module 210 of FIG. 8A and/or FIG. 8B) that is electrically connected with the flexible printed circuit board. The flexible printed circuit board may include a signal transmission part (e.g., the signal transmission part 111 of FIG. 2) that is disposed in a first direction and that includes a signal line (e.g., the signal line 111a of FIG. 2) that transmits the electrical signal and a ground part (e.g., the ground part 113 of FIG. 2) that is disposed in a second direction. The ground part may include a conductive adhesive layer (e.g., the conductive adhesive layer 115 of FIG. 3A and/or FIG. 3B) that is disposed in a direction toward the signal transmission part, and the conductive adhesive layer may include a plurality of conductive balls (e.g., the conductive balls 115a of FIG. 3A and/or the conductive balls 115b of FIG. 3B) that have electrical conductivity.

According to various embodiments, the conductive balls (e.g., the conductive balls 115a of FIG. 3A and/or the conductive balls 115b of FIG. 3B) may transmit the electrical signal of the signal line (e.g., the signal line 111a of FIG. 2).

According to various embodiments, the conductive balls (e.g., the conductive balls 115a of FIG. 3A and/or the conductive balls 115b of FIG. 3B) may exhibit isotropy.

According to various embodiments, the conductive balls (e.g., the conductive balls 115a of FIG. 3A and/or the conductive balls 115b of FIG. 3B) may exhibit anisotropy in a vertical direction for the electrical signal of the signal line (e.g., the signal line 111a of FIG. 2).

According to various embodiments, the electronic device may further include an electrically-conductive layer (e.g., the electrically-conductive layer 119 of FIG. 3B) that is disposed on an opposite side to the conductive adhesive layer (e.g., the conductive adhesive layer 115 of FIG. 3A and/or FIG. 3B).

According to the embodiments of the disclosure, by removing the ground layer in a mesh form, the impedance unbalance of the signal layer may be relieved, and the flexibility of the flexible printed circuit board may be improved.

In addition, the disclosure may provide various effects that are directly or indirectly recognized.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 1140) including one or more instructions that are stored in a storage medium (e.g., internal memory 1136 or external memory 1138) that is readable by a machine (e.g., the electronic device 1101). For example, a processor (e.g., the processor 1120) of the machine (e.g., the electronic device 1101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Although the present disclosure has been described with various embodiments, various changes and modifications may be suggested to one skilled in the art. It is intended that the present disclosure encompass such changes and modifications as fall within the scope of the appended claims.

What is claimed is:

1. A flexible printed circuit board comprising:
    a signal transmission part disposed in a first direction, the signal transmission part including a signal line configured to transmit an electrical signal; and
    a ground part disposed in a second direction, the ground part including a conductive adhesive layer disposed in the first direction, the conductive adhesive layer including an adhesive material and a metal layer surrounded by the adhesive material, the metal layer including metal needles, and the ground part configured to serve as a reference point for a voltage of the signal transmission part,
    wherein the flexible printed circuit board does not comprise a ground layer in a mesh form.

2. The flexible printed circuit board of claim 1, wherein the metal layer transmits the electrical signal of the signal line.

3. The flexible printed circuit board of claim 1, wherein each of the metal needles protrudes from the metal layer in a direction toward the signal transmission part or a direction away from the signal transmission part.

4. The flexible printed circuit board of claim 1, wherein the ground part includes an insulating protective layer disposed in the second direction.

5. The flexible printed circuit board of claim 4, wherein the metal layer is disposed between the signal transmission part and the insulating protective layer.

6. The flexible printed circuit board of claim 1, wherein:
    a connecting terminal electrically connected with the flexible printed circuit board is disposed on at least one side of the flexible printed circuit board, and
    a contact point of a ground electrically connected with the connecting terminal is formed on the ground part.

7. A flexible printed circuit board comprising:
    a first ground part disposed in a first direction;
    a second ground part disposed in a second direction; and
    a signal transmission part disposed between the first ground part and the second ground part, the signal transmission part including a signal line configured to transmit an electrical signal,
    wherein at least one of the first ground part and the second ground part includes a metal layer and an adhesive material surrounding the metal layer, the metal layer including metal needles, and the first ground part and the second ground part are configured to serve as a reference point for a voltage of the signal transmission part, and
    wherein the flexible printed circuit board does not comprise a ground layer in a mesh form.

8. The flexible printed circuit board of claim 7, wherein the metal layer transmits the electrical signal of the signal line.

9. The flexible printed circuit board of claim 7, wherein at least one of the first ground part and the second ground part includes an insulating protective layer disposed on an opposite side to the adhesive material.

10. The flexible printed circuit board of claim 9, wherein the metal layer is disposed between the signal transmission part and the insulating protective layer.

11. The flexible printed circuit board of claim 7, wherein:
    a connecting terminal electrically connected with the flexible printed circuit board is disposed on at least one side of the flexible printed circuit board, and a contact point of a ground electrically connected with the connecting terminal is formed on at least one of the first ground part and the second ground part.

12. The flexible printed circuit board of claim 11, wherein the signal transmission part transmits the electrical signal such that a control part of an electronic device and a sensor module of the electronic device are operatively connected.

13. An electronic device comprising:
a housing;
a control part located in the housing;
a flexible printed circuit board configured to transmit an electrical signal depending on a command of the control part; and
a module electrically connected with the flexible printed circuit board,
wherein the flexible printed circuit board includes:
    a signal transmission part disposed in a first direction, the signal transmission part including a signal line configured to transmit the electrical signal; and
    a ground part disposed in a second direction, the ground part including a conductive adhesive layer disposed in a direction toward the signal transmission part, the conductive adhesive layer including a metal layer and an adhesive material surrounding the metal layer, the metal layer including metal needles, and the ground part configured to serve as a reference point for a voltage of the signal transmission part, and
wherein the flexible printed circuit board does not include a ground layer in a mesh form.

* * * * *